United States Patent
Su et al.

(10) Patent No.: US 7,968,258 B2
(45) Date of Patent: Jun. 28, 2011

(54) SYSTEM AND METHOD FOR PHOTOLITHOGRAPHY IN SEMICONDUCTOR MANUFACTURING

(75) Inventors: Wei-Yu Su, Banciao (TW); Yi-Ming Dai, Shin-Chu (TW); Chi-Hung Liao, Sanchong (TW); Chun-Hung Kung, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1233 days.

(21) Appl. No.: 11/129,968

(22) Filed: May 16, 2005

(65) Prior Publication Data

US 2006/0257765 A1  Nov. 16, 2006

(51) Int. Cl.
G03F 9/00 (2006.01)
G03F 7/20 (2006.01)
(52) U.S. Cl. .............................. 430/30; 430/311; 430/22
(58) Field of Classification Search .................... 430/30, 430/5, 311, 396
See application file for complete search history.

(56) References Cited

U.S. PATENT DOCUMENTS

| 2003/0119216 A1* | 6/2003 | Weed ............................... 438/14 |
| 2003/0170552 A1* | 9/2003 | Miyashita et al. ............... 430/30 |
| 2006/0285098 A1* | 12/2006 | Fukumoto et al. .............. 355/55 |

FOREIGN PATENT DOCUMENTS
WO    WO 2005/001912 A1 *  1/2005

OTHER PUBLICATIONS

Taiwanese Patent Office, Office Action mailed Feb. 26, 2010, Application No. 095113487, 5 pages.

* cited by examiner

Primary Examiner — Kathleen Duda
Assistant Examiner — Britanny Raymond
(74) Attorney, Agent, or Firm — Haynes and Boone, LLP

(57) ABSTRACT

A method for photolithography in semiconductor manufacturing includes providing one or more masks for a wafer; defining a reference focus plane of a first mask of the one or more masks; defining a reference focus plane of a second mask of the one or more masks; and determining the best focus for the second mask based on the best focus of the first mask and the Z direction difference of the first and second masks, using the reference focus planes of the first and second masks.

16 Claims, 5 Drawing Sheets

SYSTEM AND METHOD FOR PHOTOLITHOGRAPHY IN SEMICONDUCTOR MANUFACTURING

BACKGROUND

The present disclosure relates generally to the manufacturing of semiconductor devices, and more particularly to a photolithography process in semiconductor manufacturing.

Since the inception of the semiconductor industry, photolithography has been used for forming the components of integrated circuits. The continued increase in the density of components that can be placed on a chip has been largely due to advances in photolithography, and especially the ever decreasing wavelengths of radiation. As long as the critical dimension of the components is greater than the wavelength of the radiation used to expose the photoresist, advances in the art do not require any significant changes of the masks.

However, when the wavelength of the imaging radiation is larger than the critical dimension, the effects of diffraction, though always present, become sufficiently prominent to introduce noticeable distortions into the projected images. Those distortions are particularly sensitive to the distances between the various features in the image pattern and are frequently referred to as "proximity effects."

Another problem associated with photolithography at wavelengths close to the critical dimensions is depth of focus (DOF). In particular, when the DOF is less than the thickness of the resist being exposed, image sharpness will be lost. In practice, because of diffraction effects, the resulting image often becomes a blurred circle.

When resolution is not a concern, DOF can be increased by restricting the incoming light to the center of the lens, thus reducing the angle of the light cone so that focused rays travel further before leaving the blurred circle. However, when resolution is also a consideration, that solution is no longer acceptable.

Traditionally, approaches for increasing DOF have been directed toward bringing both densely packed and isolated structures such as contact holes into simultaneous focus. However, since the increase of DOF for densely packed contact holes often result in the decrease of the DOF for isolated contact holes, such efforts frequently result in unfocused images.

To balance respective DOFs for densely packed and isolated contact holes, previously available art utilizes multiple masks with multiple exposures. For example, a first mask may be utilized for the densely packed contact holes, while a second mask may be utilized for the isolated contacted holes.

Since the variance of best focuses between masks is about 200 nm, while the DOF is about 300 nm for certain semiconductor devices, production defects may occur as a result. Thus, lithography engineers need to use the focus exposure matrix (FEM) method to identify the best focus for different masks. However, such approach is costly and timing consuming, and may cause delays in productions.

Therefore, it is desirable to adopt an improved system and method for lithography.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
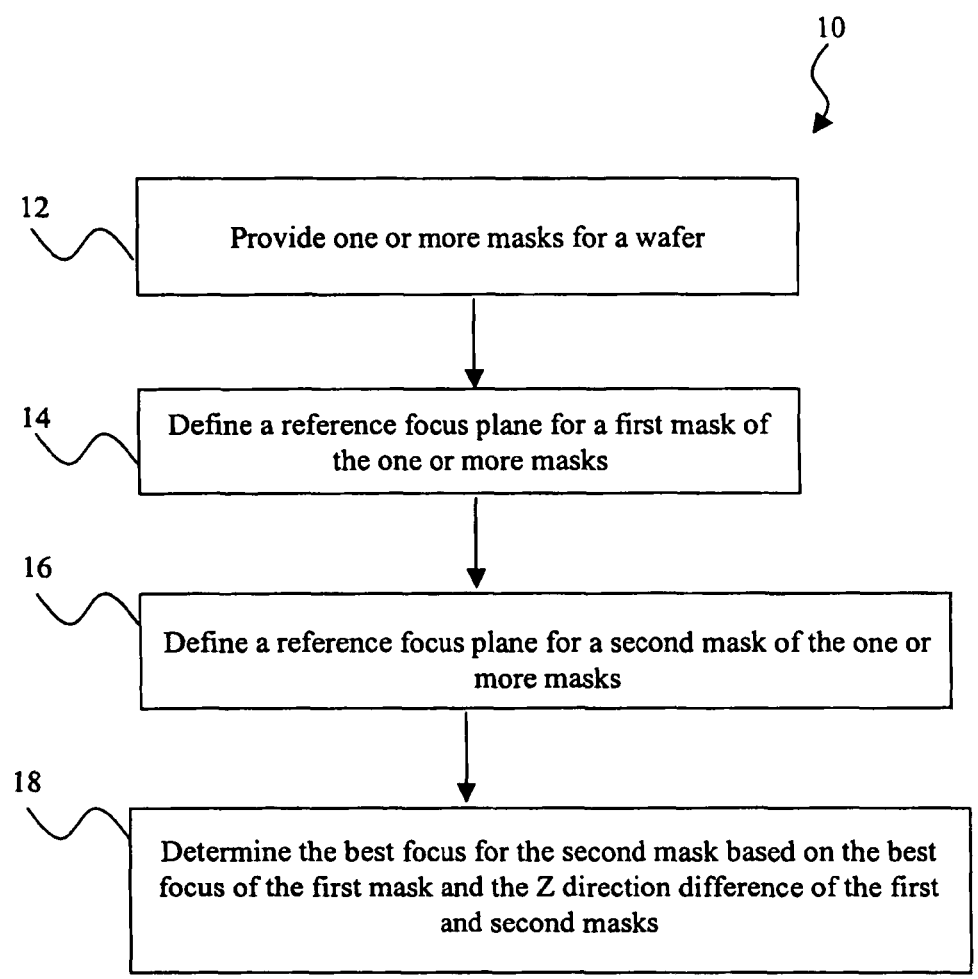
FIG. 1 illustrates a method of photolithography for implementing one or more embodiments of the present invention.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

In one embodiment, a method for predicting the best focuses for multiple masks may include defining the reference focus plane for each mask. In one example, the reference focus plane of a mask may be defined by collecting Z direction positions of various marks on the mask. Then, by first calculating the differences with respect to the reference focus planes, the best focus for each mask may be determined.

Referring now to FIG. 1, shown therein is a photolithography method 10 for implementing one or more embodiments of the present invention. The method initiates with step 12 of the method 10, which provides one or more masks for a wafer. Pursuant to step 14 of the method 10, a reference focus plane of a first mask of the one or more masks is defined, and the system is calibrated to achieve a best focus for this first mask. At step 16, a reference focus plane of a second mask of the one or more masks is defined. At step 18, a best focus for the second mask is determined based on the best focus of the first mask and a Z direction difference between the reference focus planes of the first and second masks.

The method 10 may be utilized in the manufacturing of a variety of semiconductor devices, such as memory devices (including but not limited to a static random access memory (SRAM)), logic devices (including but not limited to a metal-oxide semiconductor field-effect transistor (MOSFET)), and/or other devices. The method 10 begins at step 12 wherein a mask 24 is provided.

Figure 2:
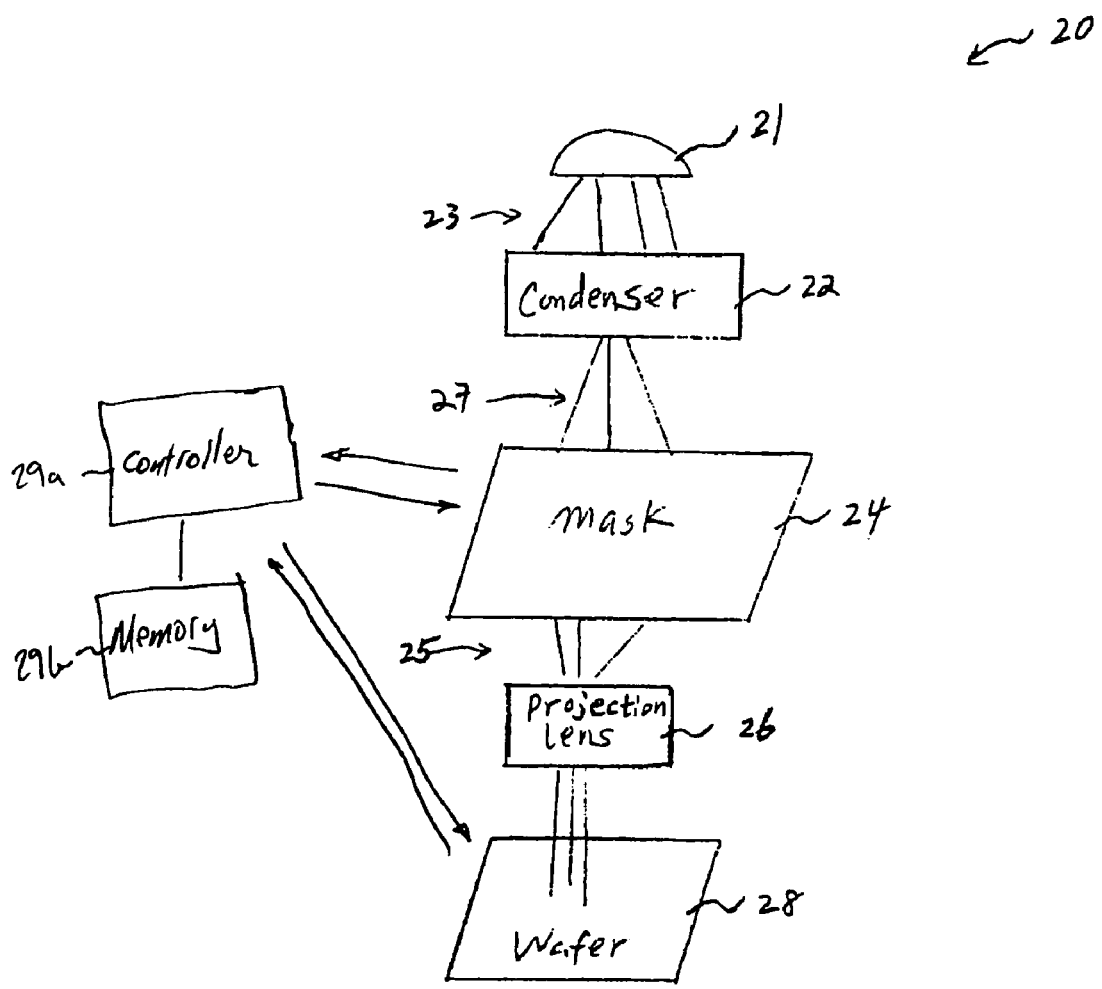
FIG. 2 illustrates a photolithography system for implementing one or more embodiments of the present invention.

Referring now to FIG. 2, the mask 24 used in step 12 of the method 10 can be illustrated as part of a simplified exemplary lithography system 20. In this embodiment, a light source 21 emits light beams 23, which are condensed by a condenser 22. As a result, the mask 24, which includes patterns, is illuminated uniformly by light beams 27. After passing through the mask 24, light beams 25 are focused by a projection lens 26 prior to being projected onto a wafer 28.

The lithography system 20 also includes a controller 29a with memory 29b. The controller 29a may be a typical computer-type system that is capable of receiving input from a user and/or one or more of the masks 24. The controller 29a can perform best-focus calculations based on various measurements from different components of the system 20, including the wafer 28. In one method, the controller can determine a best focus for a wafer using conventional methods, such as measuring a distance to a top surface of the wafer. The controller 29a can also store and retrieve information about the best focus, as well as mask-dependent information, in the memory 29b. The controller 29a can use this stored information for sending additional control signals for determining a best focus for several different masks in an improved manner as taught by the present disclosure.

Figure 3A:
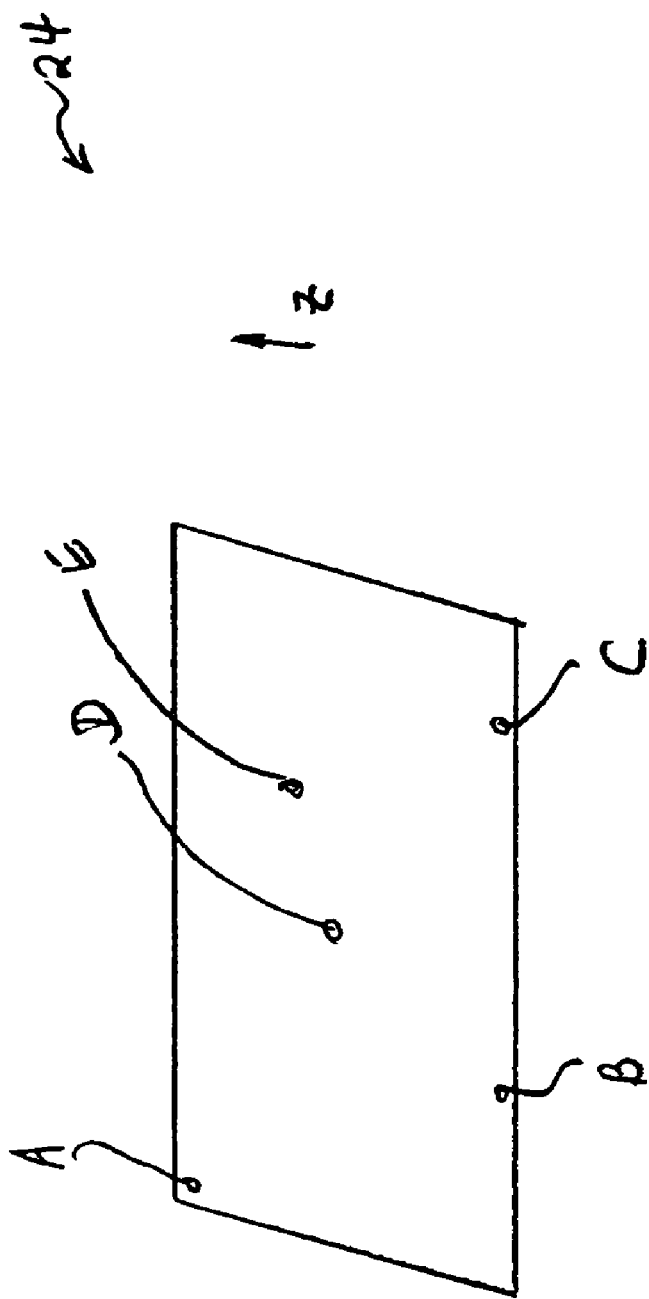
FIG. 3a illustrates a partial view of a mask for use in the photolithography system of FIG. 2.

Referring also to FIG. 3a, the mask 24 may be a high precision plate containing microscopic images of electronic circuits. The mask 24 may include a variety of materials, such as quartz, soda lime, white crown, and/or other materials. Generally, a layer of chrome may be included on one side of the mask 24, and electronic circuits (frequently referred to as geometry) may be etched in the chrome layer. The thickness of the mask 24 may be any suitable thickness known in the art.

In furtherance of the example, the mask 24 includes marks A, B and C, all of which are located approximately near or at the edge of the mask 24. The mask 24 further includes marks D and E, both of which are located approximately near the center of the mask 24.

Figure 3B:
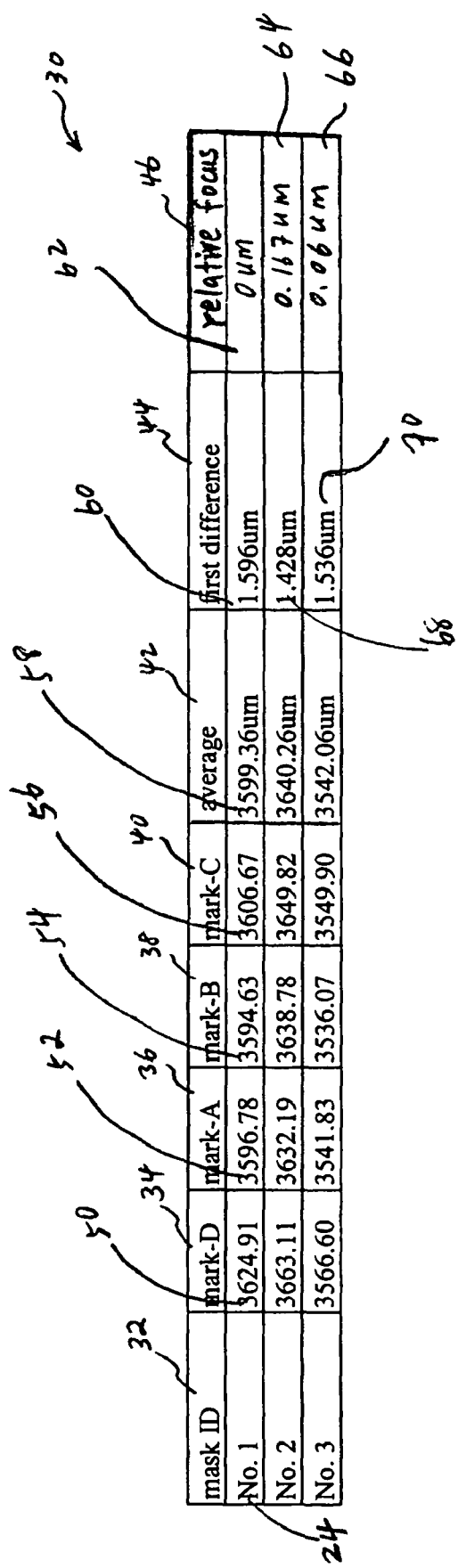
FIG. 3b illustrates data relating to marks residing on masks for implementing one or more embodiments of the present invention.

Step 14 of the method 10 will now be described in further detail. Referring also to FIG. 3b, in one example, the Z direction positions of the marks A-D are measured by methods known in the art, and recorded in the first row of a table 30 (designated as mask ID No. 1). Accordingly, the Z direction positions of the marks D, A, B, and C are designated as Z positions 50, 52, 54, and 56, respectively. As illustrated in the table 30, the Z position 50 for the mark D is 3624.91 um. Then, an average position 58 for the marks located approximately near or at the edge of the mask 24 (marks A, B and C) is calculated by averaging the figures for Z positions 52, 54, and 56 as follows: the average position 58=the average of the Z direction positions 52, 54 and 56=(3596.78+3594.63+3606.67)*⅓=3599.36 um.

Thereafter, a first difference 60 is calculated by obtaining the difference of the Z direction position 50 and the average position 58, taking into consideration of an optical design factor (not shown). Thus, the first difference 60=(Z direction position 50−the average position 58)/(an optical factor)=(3624.91−3599.36)/16=1.596 um. It is noted that even though in this example, the optical design factor is designated as 16, other figures (such as 9, 25, and other numbers) are also contemplated by this disclosure. Generally, the optical factor is determined by the specific lithography system. In this example, a scanner used for the lithography system is a 4× scanner, thus the optical design factor may become 4×4=16 in this case.

It is noted that many variations of the first row data are contemplated by the present disclosure. In one example, instead of merely collecting the Z direction position 50 of the mark D, Z directions for two or more marks that are away from the edge of the mask No. 1 may be measured and averaged to arrive at a second average position. In that case, the first difference 60 will be calculated based on the difference between the second average position and the average position 58 (as opposed to the difference between the Z direction position 50 and the average position 58, as described above). In a second example, instead of collecting the Z direction positions of marks A, B and C, the Z direction positions of a fewer or greater number of marks that are approximately at or near the edge of the mask 24 are measured and averaged to arrive at the first difference 60. It is noted that the two examples described in this paragraph are also applicable to masks No. 2 and/or No. 3.

The photolithography system 20 (FIG. 2) is then calibrated for a best focus of mask No. 1. The system can use some, all, or none of the measurements and calculations discussed above. For example, the system can calibrate best focus using traditional calibration methods provided by the system. Alternatively or in addition, some of the calculations above can be used in calibrating the system.

Step 16 of the method 10 will now be described in greater detail. In furtherance of the example, the second row data of the table 30, which represent the pertinent Z direction positions for a second mask (designated as mask ID No. 2), may be obtained and calculated similarly to the descriptions for the first row data of the table 30. Likewise, the third row data of the table 30, which represent the pertinent Z direction positions for a third mask (designated as mask ID No. 3), may be obtained and calculated similarly to the descriptions for the first row data of the table 30.

Step 18 of the method 10 will now be described in greater detail. In furtherance of the example, data for a relative focus column 46 may be calculated based on the first differences 60, 68, and 70. In this example, a relative focus 64 is based on the difference between the first and second differences 60 and 68. Thus, the relative focus 64=(the first difference 60−the first difference 68)=1.596−1.428=0.167 um.

Similarly, a relative focus 66 is based on the difference between the first and third differences 60 and 70. Thus, the relative focus 66=(the first difference 60−the first difference 70)=1.596−1.536=0.06 um.

In furtherance of the example, once the best focus for the mask No. 1 has been identified, then the best focuses for the masks No. 2 and No. 3 may be determined based on the relative focuses 64 and 66, which represent the Z direction adjustments that may be made for the masks No. 2 and No. 3. In one example, following a first exposure utilizing the mask No. 1, the mask No. 2 may be utilized for purposes of a second exposure. Prior to the second exposure, the wafer 28 may be moved toward the mask No. 2 in the Z direction by approximately the distance of the relative focus 64, which is 0.167 um in this example. Similarly, in another example, prior to a second exposure utilizing the mask No. 3, the wafer 28 may be moved toward the mask No. 3 in the Z direction by approximately the distance of the relative focus 66, which is 0.06 um in this example.

Figure 4:
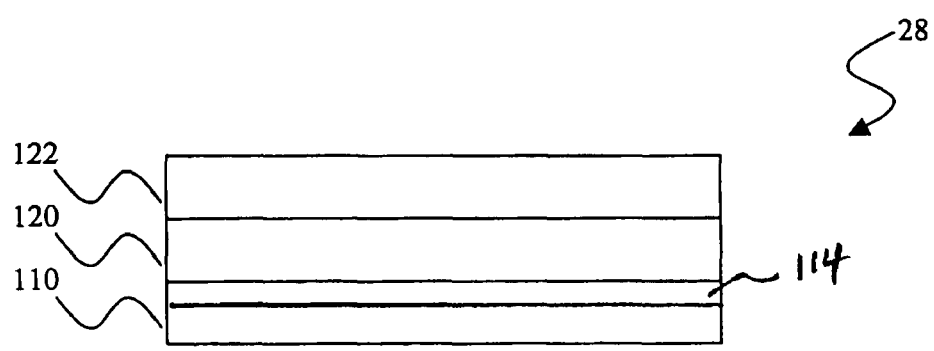
FIG. 4 illustrates a partial semiconductor device for implementing one or more embodiments of the present invention.

Referring now to FIG. 4, for the sake of example, the wafer 28 of FIG. 2 is expanded to include a substrate 110, a dielectric layer 114, a bottom anti-reflective coating (BARC) layer 120, and a photoresist layer 122.

The substrate 110 may include one or more insulator, conductor, and/or semiconductor layers. For example, the substrate 110 may include an elementary semiconductor, such as crystal silicon, polycrystalline silicon, amorphous silicon, and/or germanium; a compound semiconductor, such as silicon carbide and/or gallium arsenic; an alloy semiconductor, such as SiGe, GaAsP, AlInAs, AlGaAs, and/or GaInP. Further, the substrate 110 may include a bulk semiconductor, such as bulk silicon, and such a bulk semiconductor may include an epi silicon layer. It may also or alternatively include a semiconductor-on-insulator substrate, such as a silicon-on-insulator (SOI) substrate, or a thin-film transistor (TFT) substrate. The substrate 110 may also or alternatively include a multiple silicon structure or a multilayer compound semiconductor structure.

The dielectric layer 114 may be deposited over the surface of the substrate 110. The dielectric layer 114 may be formed by chemical vapor deposition (CVD), plasma-enhanced CVD (PECVD), atomic layer deposition (ALD), physical vapor deposition (PVD), spin-on coating and/or other processes. The dielectric layer 114 may be an inter-metal dielectric (IMD), and may include low-k materials, silicon dioxide, polyimide, spin-on-glass (SOG), fluoride-doped silicate glass (FSG), Black Diamond® (a product of Applied Materials of Santa Clara, Calif.), Xerogel, Aerogel, amorphous fluorinated carbon, and/or other materials.

The BARC layer 120 may be deposited over the dielectric layer 114 by a variety of techniques, including but not limited to spin-on coating, PVD, CVD, and/or other processes.

In one example, the BARC layer 120 may absorb the light that inadvertently penetrates the bottom of a photoresist layer (not shown). To perform the light absorption, the BARC layer 120 may include a material with a high extinction coefficient, and/or considerable thickness. On the other hand, a high coefficient of the BARC layer 120 may lead to the high reflectivity of the BARC layer, which counters the effectiveness of the BARC layer 120. Accordingly, it is contemplated that the BARC layer 120 may possess a coefficient value at approximately between about 0.2 to about 0.5, and may possess a thickness of about 200 nm. However, it is noted that other ranges of coefficient values and thickness are also contemplated by the present disclosure.

Additionally or alternatively, an index matching approach may be adopted for the BARC layer 120. In that case, the BARC layer 120 may include a material with a refraction index and thickness that match those of the light. In operation, once the light strikes the BARC layer 120, a portion of the light is reflected therefrom. Meanwhile, another portion of the light enters the BARC layer 120 and is transformed into a light with a shifted phase, which interferes with the first portion of the light that is reflected from the BARC layer 120, resulting in the reduction of the light reflectivity.

It is contemplated that the BARC layer 120 may employ both the light absorption and index matching approaches to achieve the desired results. In some instances, the BARC layer 120 may simply remain over the dielectric layer 114 and serve as a diffusion barrier for the wafer 18, as the removal of the BARC layer 120 may be difficult to accomplish.

The photoresist layer 122 may be deposited over the BARC layer 120, and formed by spin-on coating and/or other processes. In operation, a photoresist solution is dispensed onto the surface of a partial wafer, and the wafer 28 is spun rapidly until the photoresist solution is almost dry. In one example, the photoresist layer 112 may be a chemically amplified resist that employs acid catalysis. In that case, the photoresist layer may be formulated by dissolving an acid sensitive polymer in a casting solution.

Following the deposition of the photoresist layer 122, the wafer 28 may undergo a soft bake (known in the art) and one or more exposure processes (described above in connection with the method 10).

Thereafter, additional steps are adopted for forming a complete semiconductor device. Since those additional steps are known in the art, they will not be further described herein.

It is noted that many variations of the above example are contemplated herein. In one example, the above method of determining the best focus of at least one mask may be applied to phase shift masks. In a second example, the above method of determining the best focus of at least one mask may be applied to multiple masks that are not phase shift masks. Therefore, a variety of modifications is contemplated by this disclosure.

Although only a few exemplary embodiments of this disclosure have been described in details above, those skilled in the art will readily appreciate that many modifications are possible in the exemplary embodiments without materially departing from the novel teachings and advantages of this disclosure. Also, features illustrated and discussed above with respect to some embodiments can be combined with features illustrated and discussed above with respect to other embodiments. Accordingly, all such modifications are intended to be included within the scope of this disclosure.

What is claimed is:

1. A method for performing photolithography in a photolithography system, comprising:
   providing a first mask and a second mask for patterning a wafer, the first mask having a first set of marks and the second mask having a second set of marks;
   defining a first reference focus plane for the first mask based on the first set of marks;
   determining a best focus of the first mask using a calibration routine of the photolithography system;
   defining a second reference focus plane for the second mask based on the second set of marks;
   determining a Z direction difference between the first reference focus plane and the second reference focus plane;
   determining a best focus of the second mask based on the best focus of the first mask and the Z direction difference between the first and second reference focus planes;
   providing a third mask for patterning the wafer, the third mask having a third set of marks;
   defining a third reference focus plane of the third mask based on the third set of marks;
   determining a Z direction difference between the first reference focus plane and the third reference focus plane; and
   determining a best focus of the third mask based on the Z direction difference between the first and third reference focus planes.

2. The method of claim 1 wherein defining the first reference focus plane for the first mask and the second reference focus plane for the second mask comprises measuring Z direction positions of the first and second set of marks.

3. The method of claim 1 further comprising:
   positioning the first mask over the wafer such that a first Z direction distance is between the wafer and the first mask, the first Z direction distance achieving the best focus of the first mask;
   performing a first exposure process on the wafer with the first mask;
   positioning the second mask over the wafer, wherein the first Z direction distance is between the wafer and the second mask;
   adjusting a position of the wafer relative to the second mask based on the Z direction difference such that a second Z direction distance is between the wafer and the second mask, the second Z direction distance achieving the best focus of the second mask; and
   performing a second exposure process on the wafer with the second mask.

4. The method of claim 1 further comprising:
   performing a first exposure process on the wafer with the first mask positioned for the best focus of the first mask; and performing a second exposure process on the wafer with the second mask positioned for the best focus of the second mask.

5. The method of claim 1 wherein defining the first reference focus plane for the first mask and the second reference focus plane for the second mask comprises:
  measuring Z direction positions of at least three marks near or at the edge of the first mask and at least three marks near or at the edge of the second mask; and
  measuring a Z direction position of at least one mark near the center of the first mask and at least one mark near the center of the second mask.

6. The method of claim 1 wherein defining the first reference focus plane for the first mask based on the first set of marks comprises:
  measuring Z direction positions of at least three marks near or at the edge of the first mask;
  calculating an average Z direction position of the at least three marks near or at the edge of the first mask;
  measuring a Z direction position of at least one mark that is not near or at the edge of the first mask;
  calculating a difference between the average Z direction position and the Z direction position of the at least one mark that is not near or at the edge of the first mask; and
  calculating a first difference by dividing the difference by an optical design factor.

7. The method of claim 6 wherein defining the second reference focus plane for the second mask based on the second set of marks comprises:
  measuring Z direction positions of at least three marks near or at the edge of the second mask;
  calculating an average Z direction position of the at least three marks near or at the edge of the second mask;
  measuring a Z direction position of at least one mark that is not near or at the edge of the second mask;
  calculating a difference between the average Z direction position and the Z direction position of the at least one mark that is not near or at the edge of the second mask; and
  calculating a second difference by dividing the difference by the optical design factor.

8. The method of claim 7 wherein determining the Z direction difference between the first reference focus plane and the second reference focus plane comprises determining a difference between the first difference and the second difference.

9. The method of claim 1 further comprising utilizing an optical design factor to determine the Z direction difference between the first and second reference focus planes.

10. The method of claim 1 further comprising adjusting a position of the wafer based on the Z direction difference.

11. The method of claim 1 further comprising adjusting a position of the second mask based on the Z direction difference.

12. The method of claim 1, wherein the best focus of the first mask is different than the best focus of the second mask.

13. The method of claim 12, wherein the best focus of the second mask is different that the best focus of the third mask.

14. A method for photolithography in semiconductor manufacturing, comprising:
  determining a first Z direction distance between a wafer and a first mask, wherein the first Z direction distance achieves a best focus for the first mask;
  performing a first exposure process on the wafer with the first mask positioned over the wafer such that the first Z direction distance is between the wafer and the first mask;
  determining a relative focus between the first mask and a second mask;
  positioning the second mask over the wafer such that the first Z direction distance is between the wafer and the second mask;
  adjusting a position of the wafer in a Z direction relative to the second mask based on the relative focus, such that there is a second Z direction distance between the wafer and the second mask, wherein the second Z direction distance achieves a best focus for the second mask;
  performing a second exposure process on the wafer with the second mask positioned over the wafer such that the second Z direction distance is between the wafer and the second mask;
  providing one or more additional masks for patterning the wafer, an exposure process being performed on the wafer with each additional mask, the exposure process including:
  determining a relative focus between the first mask and the additional mask;
  positioning the additional mask over the wafer such that the first Z direction distance is between the wafer and the additional mask;
  adjusting a position of the wafer in a Z direction relative to the additional mask based on the relative focus between the first and additional mask, such that there is a Z direction distance associated with the additional mask, the Z direction distance being between the wafer and the additional mask and achieving a best focus for the additional mask.

15. The method of claim 14, wherein determining the relative focus between the first and second masks comprises:
  defining a first reference focus plane for the first mask by measuring Z direction positions of marks on the first mask, averaging selected Z direction positions, and obtaining a first difference based on a Z direction position and the average of Z direction positions;
  defining a second reference focus plane for the second mask by measuring Z direction positions of marks on the second mask, averaging selected Z direction positions, and obtaining a second difference based on a Z direction position and the average of Z direction positions; and
  determining a Z direction difference between the first difference and the second difference, the Z direction difference being the relative focus.

16. The method of claim 15 further comprising utilizing a predetermined optical design factor for calculating the first and second differences.

* * * * *